US011251275B2

(12) United States Patent
Altstaetter et al.

(10) Patent No.: US 11,251,275 B2
(45) Date of Patent: Feb. 15, 2022

(54) NEEDLE CELL TRENCH MOSFET

(71) Applicant: Infineon Technologies Austria AG, Villach (AT)

(72) Inventors: Christof Altstaetter, Villach (AT); Marcel Rene Mueller, Bendorf (DE); Oliver Blank, Villach (AT); David Laforet, Villach (AT)

(73) Assignee: Infineon Technologies Austria AG, Villach (AT)

( * ) Notice: Subject to any disclaimer, the term of this patent is extended or adjusted under 35 U.S.C. 154(b) by 11 days.

(21) Appl. No.: 16/537,101

(22) Filed: Aug. 9, 2019

(65) Prior Publication Data

US 2020/0052077 A1 Feb. 13, 2020

(30) Foreign Application Priority Data

Aug. 10, 2018 (DE) .......................... 102018119512.5

(51) Int. Cl.
| | |
|---|---|
| *H01L 29/76* | (2006.01) |
| *H01L 21/336* | (2006.01) |
| *H01L 29/40* | (2006.01) |
| *H01L 29/423* | (2006.01) |
| *H01L 29/78* | (2006.01) |
| *H01L 29/66* | (2006.01) |
| *H01L 29/739* | (2006.01) |
| *H01L 21/768* | (2006.01) |
| *H01L 21/8234* | (2006.01) |
| *H01L 21/28* | (2006.01) |

(52) U.S. Cl.
CPC ...... *H01L 29/407* (2013.01); *H01L 21/28035* (2013.01); *H01L 21/768* (2013.01); *H01L 21/823475* (2013.01); *H01L 21/823487* (2013.01); *H01L 29/404* (2013.01); *H01L 29/4236* (2013.01); *H01L 29/66734* (2013.01); *H01L 29/7397* (2013.01); *H01L 29/7811* (2013.01); *H01L 29/7813* (2013.01)

(58) Field of Classification Search
CPC .............. H01L 29/407; H01L 29/4236; H01L 29/7813; H01L 29/66734; H01L 29/0696; H01L 29/7397; H01L 29/404; H01L 29/7811; H01L 29/4238; H01L 29/66348; H01L 29/401; H01L 29/41741; H01L 29/861; H01L 29/0847; H01L 29/402; H01L 21/823475; H01L 21/823487; H01L 29/7391; H01L 21/28035; H01L 21/768
See application file for complete search history.

(56) References Cited

U.S. PATENT DOCUMENTS

2003/0047777 A1* 3/2003 Zandt .................... H01L 29/404
257/329
2010/0308400 A1 12/2010 Darwish et al.
(Continued)

*Primary Examiner* — Shouxiang Hu
(74) *Attorney, Agent, or Firm* — Murphy, Bilak & Homiller, PLLC

(57) ABSTRACT

A power semiconductor die has a semiconductor body coupled to first and second load terminals, and at least one power cell. In a horizontal cross-section of the at least one power cell, a contact has a contact region which horizontally overlaps with a field plate electrode and horizontally protrudes from the field plate trench, and a recess region does not horizontally overlap with the contact region and extends into a horizontal circumference of the field plate trench.

22 Claims, 8 Drawing Sheets

(56) References Cited

U.S. PATENT DOCUMENTS

| | | | |
|---|---|---|---|
| 2014/0239386 A1* | 8/2014 | Zeng | H01L 29/41766 257/330 |
| 2014/0252463 A1* | 9/2014 | Darwish | H01L 29/407 257/330 |
| 2016/0064496 A1* | 3/2016 | Siemieniec | H01L 29/41766 257/331 |
| 2016/0079376 A1* | 3/2016 | Hirler | H01L 29/41758 257/328 |

* cited by examiner

NEEDLE CELL TRENCH MOSFET

TECHNICAL FIELD

This specification is directed to embodiments of a power semiconductor die and to embodiments of a method of processing a power semiconductor die. In particular, this specification is directed embodiments of a MOSFET having a field plate electrode included in a needle cell trench and to corresponding embodiments of a processing method.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the device. A first load terminal, e.g., a source terminal, may be arranged at a front side of the die, and a second load terminal, e.g., a drain terminal, may be arranged at a back side of the die. The die may be included within a package of the power semiconductor device, wherein such package may provide for electrical connections to the load terminals.

Further, the load current path may be controlled by means of a control electrode, often referred to as gate electrode. For example, upon receiving a corresponding control signal from, e.g., a driver unit, the control electrode may set the power semiconductor die in one of a conducting state and a blocking state.

For conducting the load current, the power semiconductor die may have one or more power cells which may be arranged in a so-called active region of the power semiconductor device. For example, within the active region, the one or more power cells are electrically connected to the front side load terminal.

The active region may be configured with a stripe pattern, according to which the power cells extend in a stripe like manner through the entire active region or substantial parts thereof, or the active region may be configured with a cellular/grid pattern, according to which the power cells exhibit a columnar design (also referred to as "needle design") and are distributed within the active region.

The present specification is directed to the latter case, i.e., to a die with an active region where the cells are arranged in accordance with a grid pattern. For example, in accordance with such grid pattern, gate trenches may form grid openings (e.g., grid meshes), and each grid opening may spatially confine one power cell. For example, the gate trenches extend longitudinally, in the active region, along linear lines that perpendicularly cross each other. Further, in each grid opening, there may be arranged a columnar (e.g. needle) trench housing a columnar (e.g. needle) trench electrode connected to a different electrical potential as compared to gate electrodes in the gate trenches.

The power semiconductor die is laterally confined by a die edge, and between the die edge and the active region, there is usually arranged a so-called edge termination region. In terms of power semiconductor dies, such edge termination region is also referred to as a "high voltage termination structure", and it may serve the purpose of supporting the voltage handling capability of the power semiconductor die, e.g., by influencing the course of the electric field within the semiconductor die, e.g., so as to ensure reliable blocking capability of the power semiconductor die.

A reliable blocking capability is desirable. To this end, a respective field plate electrode may be arranged in one or more of the power cells.

On the other hand, a high density of power cells within the active region may be desirable in terms of handling high load currents at low conduction losses.

Further, it may be desirable to contact each field plate electrode so as to connect them to one of the load terminals, e.g., to the source terminal of a MOSFET.

SUMMARY

In accordance with some embodiments described herein, it is proposed, at least for one of the power cells of a needle trench MOSFET, to include the field plate electrode in a columnar field plate trench. A contact can be provided that established an electrical connection between, on the one side, the source terminal of the MOSFET and, on the other side, each of the semiconductor channel zone, the semiconductor source zone and the field plate electrode.

It is proposed to provide a contact with a contact structure with conducting contact region and an insulating recess region that jointly define a structured horizontal layout of the contact, e.g., according to which the contact region exhibits a cross arrangement. For example, a central portion of the cross arrangement contacts the field plate electrode, whereas distal (outer) portions of the cross arrangement contact both the semiconductor channel region and the semiconductor source region.

For example, the central portion of the contact region overlaps horizontally entirely with the field plate electrode. Further, the contact region may extend radially from the central portion so as to establish contact with both the semiconductor channel zone, the semiconductor source zone. For example, the contact region is arranged radial-symmetrically with the field plate electrode.

The recess region may form a non-contact region. For example, the recess region horizontally overlaps with both the source zone and the field insulator, i.e., it may extend into the horizontal circumference of the field plate trench.

For example, the recess region may form, at least partially, a support structure increasing stability of the wafer in which the power semiconductor die is implemented. A further increase of stability of the wafer may be achieved due to the reduced amount of the electrically conductive material (e.g., tungsten). For example, without the recess region, an open area (where the contact is to be established) would be such that a complete fill of the contact requires thicknesses of electrically conductive material (e.g., tungsten) of at least half the diameter of the contact, which may lead to wafer bow issues. Additionally, the structured horizontal layout formed by the contact region and the recess region may be more advantageous in terms of processing and costs.

Another advantage may be that, for example, by focusing the electrically contact into corner regions of the cell, the cell pitch may be reduced.

In accordance with an embodiment, a power semiconductor die has a semiconductor body coupled to a first load terminal and a second load terminal of the power semiconductor die and configured to conduct a load current between the load terminals. At least one power cell of the die has: as a respective part of the semiconductor body, a section of a drift zone of a first conductivity type, a section of a channel zone of a second conductivity type and a section of a source zone of the first conductivity type, wherein the channel zone section is electrically connected to the first load terminal and isolates the source zone section from the drift zone section; a columnar field plate trench extending into the semiconductor body along the vertical direction, the columnar field plate trench including a field plate electrode and a field insulator, the field insulator forming a field plate trench sidewall of the columnar field plate trench; a control trench structure for controlling the load current, the control trench structure extending into the semiconductor body along the vertical direction and surrounding the columnar field plate trench, the control trench structure including at least one control electrode section and a control trench insulator, the control trench insulator forming control trench sidewalls of the control trench structure; a contact configured for establishing an electrical connection between the first load terminal and each of channel zone section, the source zone section and the field plate electrode, wherein, in a horizontal cross-section of the at least one power cell: the contact has a contact region horizontally overlapping with the field plate electrode and horizontally protruding from the field plate trench; and a recess region horizontally not overlapping with the contact region, but horizontally overlapping with the source zone section and extending into a horizontal circumference of the field plate trench.

In accordance with a further embodiment, a method of processing a power semiconductor die is presented. The method comprises forming a semiconductor body to be coupled to a first load terminal and a second load terminal of the power semiconductor die and configured to conduct a load current between the load terminals. The method further comprises forming at least one power cell having: as a respective part of the semiconductor body, a section of a drift zone of a first conductivity type, a section of a channel zone of a second conductivity type and a section of a source zone of the first conductivity type, wherein the channel zone section is electrically connected to the first load terminal and isolates the source zone section from the drift zone section; a columnar field plate trench extending into the semiconductor body along the vertical direction, the columnar field plate trench including a field plate electrode and a field insulator, the field insulator forming a field plate trench sidewall of the columnar field plate trench; a control trench structure for controlling the load current, the control trench structure extending into the semiconductor body along the vertical direction and surrounding the columnar field plate trench, the control trench structure including at least one control electrode section and a control trench insulator, the control trench insulator forming control trench sidewalls of the control trench structure; a contact configured for establishing an electrical connection between the first load terminal and each of channel zone section, the source zone section and the field plate electrode, wherein, in a horizontal cross-section of the at least one power cell: the contact has a contact region horizontally overlapping with the field plate electrode and horizontally protruding from the field plate trench; and a recess region horizontally not overlapping with the contact region, but horizontally overlapping with the source zone section and extending into a horizontal circumference of the field plate trench.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
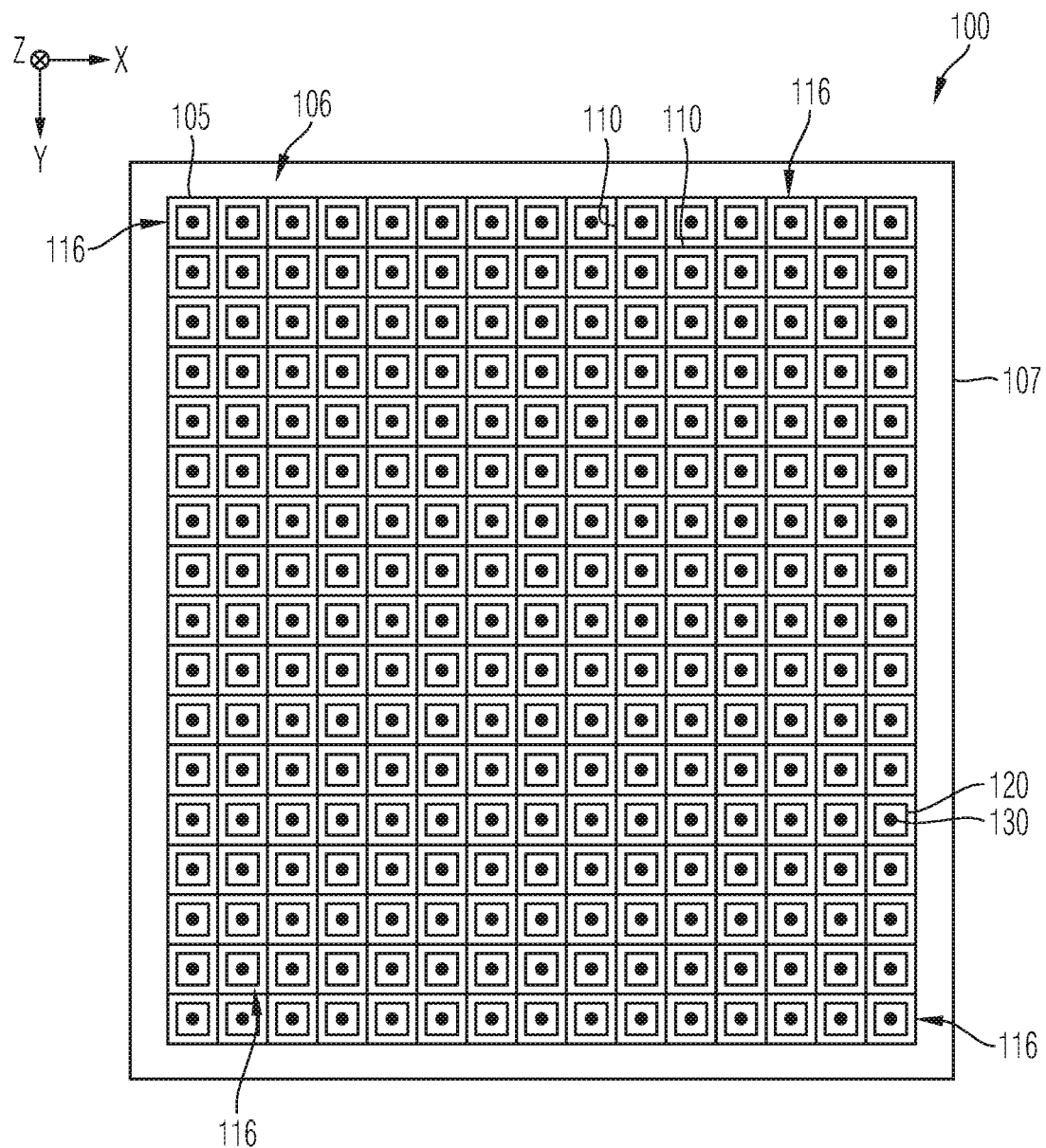
FIG. 1 schematically and exemplarily illustrates a section of a horizontal projection of a power semiconductor die in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein.

Further, in the context of the present specification, the term "in contact" intends to describe that there is a direct physical connection between two elements of the respective semiconductor device; e.g., a transition between two elements being in contact with each other may not include a further intermediate element or the like; i.e., said two elements may be in touch with each other.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

In this specification, n-doped is referred to as "first conductivity type", while p-doped is referred to as "second conductivity type". Alternatively, opposite doping relations can be employed so that the first conductivity type can be p-doped and the second conductivity type can be n-doped.

Specific embodiments described in this specification pertain to, without being limited thereto, a power semiconductor die, e.g., a power semiconductor die that may be used within a power converter or a power supply. For example, the power semiconductor die described herein is configured to be employed within power rectifier or within a power inverter, e.g., within a synchronous power rectifier or power inverter. For example, such rectifier/inverter is used as a part of a motor drive. Thus, in an embodiment, the power semiconductor die described herein can be configured to carry a part of a current that is to be fed to a load and/or, respectively, that is provided by a power source.

Accordingly, the term "power semiconductor die" as used in this specification intends to describe a single die with high voltage blocking and/or high current-carrying capabilities. In other words, such power semiconductor die is intended for high current, typically in the Ampere range, e.g., up to 5 or 300 Amperes, and/or voltages typically above 15 V, more typically up to 400 V, and above, e.g., up to at least 500 V or more than 500 V, e.g. at least 600 V. Further, the power semiconductor die described herein can be configured for high switching frequencies, e.g., for a switching frequency of at least 100 kHz and up to 2 MHz.

For example, the power semiconductor die described below may be a die that is configured to be employed as a power component in a low-, medium- and/or high voltage application.

Further, the term "power semiconductor die" as used in this specification is not directed to logic semiconductor devices that are used for, e.g., storing data, computing data and/or other types of semiconductor-based data processing.

For example, the die may comprise one or more active power cells, such as a monolithically integrated transistor cell, e.g., a monolithically integrated MOSFET cell and/or derivatives thereof. A plurality of such power cells may be integrated in the die.

In accordance with the embodiments described herein, the power semiconductor die includes power cells which are of the columnar/needle type. For example, the power cells are not of the stripe type. The columnar/needle type cells can each comprise at least one columnar trench, e.g., a columnar field plate trench. For example, in accordance with such columnar/needle configuration, the total lateral extensions of each columnar/needle power cell along each of the first lateral direction X and the second lateral direction Y amount to only a fraction of the total lateral extensions along the first lateral direction X and the second lateral direction Y of the power semiconductor die. For example, the total lateral extension of a respective columnar/needle cell amounts to less than 1%, or to even less than 0.05% of the total extension of the power semiconductor die along one of the first lateral direction X and the second lateral direction Y. For example, a die with a side length of approx. 4 mm along the first lateral direction X and a typical cell pitch of approx. 2 μm leads to total lateral extension of a respective columnar/needle cell of approx. 2/4000=0.05% of the total extension of the die along the first lateral direction X. Further, each columnar/needle cell can exhibit, in parallel to the XY-plane, a rectangular, e.g., a quadratic horizontal cross-section, e.g., a rectangular horizontal cross-section with rounded corners, or an elliptical horizontal cross-section, or a circular horizontal cross-section, or a polygonal, e.g., an octagonal or a hexagonal horizontal cross-section. The course of such cross-sections may be defined by means of grid pattern of control trench structure, as will become more apparent from the description of the drawings.

In an embodiment, each columnar/needle power cell has a maximum lateral extension and a maximum vertical extension, wherein the maximum lateral extension is smaller than ½, ⅓, ¼ or ⅕ of the maximum vertical extension or even yet smaller than ⅙ of the maximum vertical extension. For example, the maximum vertical extension is defined by the total extension of the columnar field plate trench (as mentioned below) along the vertical direction of the respective columnar/needle power cell.

In the following, the term power cell refers to a columnar/needle power cell, e.g., as exemplary defined above.

As used herein, the term "needle" includes but is not limited to designs according to which a trench bottom is tapered (like a needle); rather, the term "needle" also includes those designs according to which the trench bottom is substantially flat, e.g., extends horizontally.

Figure 2:
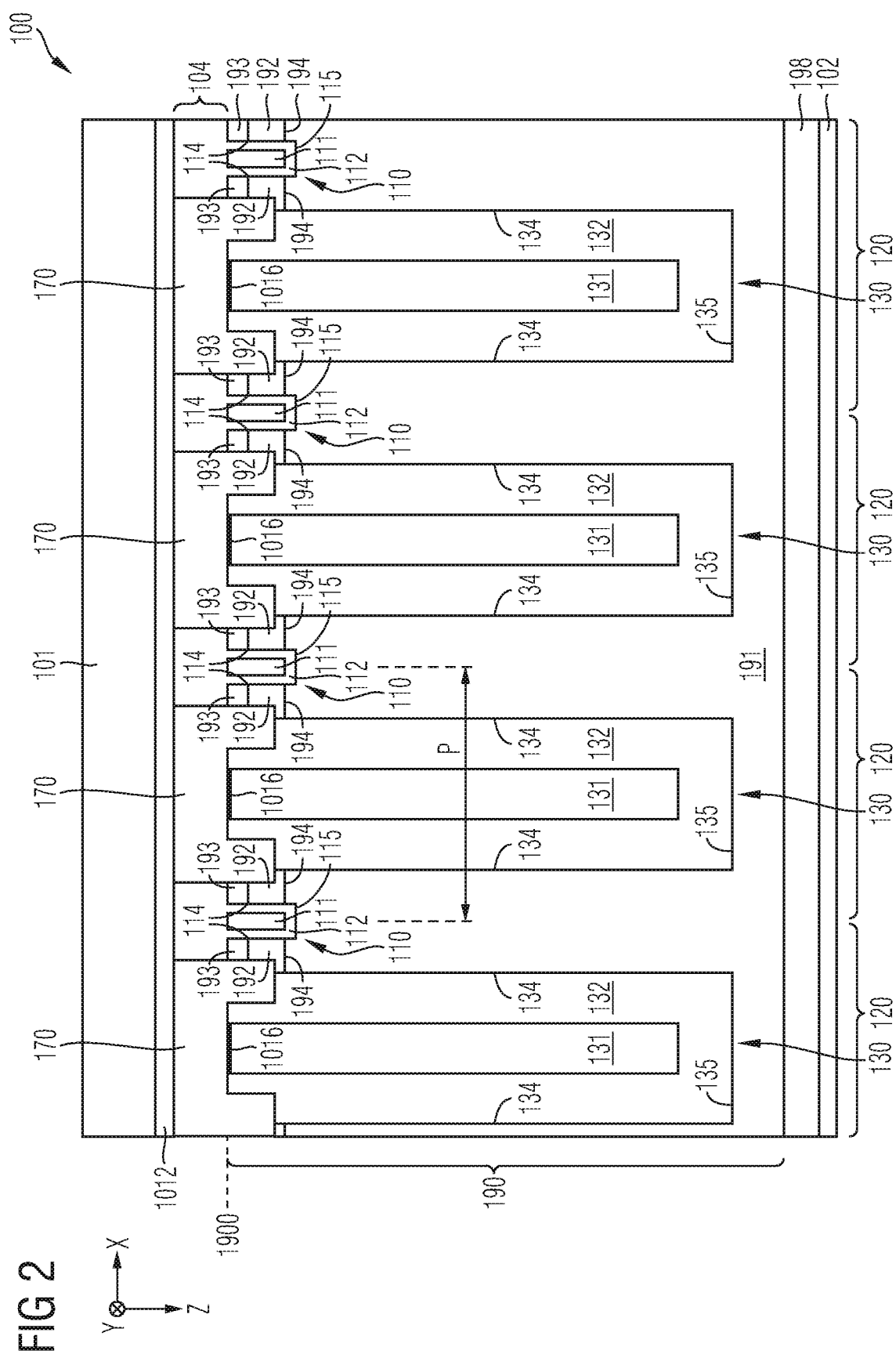
FIG. 2 schematically and exemplarily illustrates a section of a vertical cross-section of a power semiconductor die in accordance with one or more embodiments.
Figure 3:
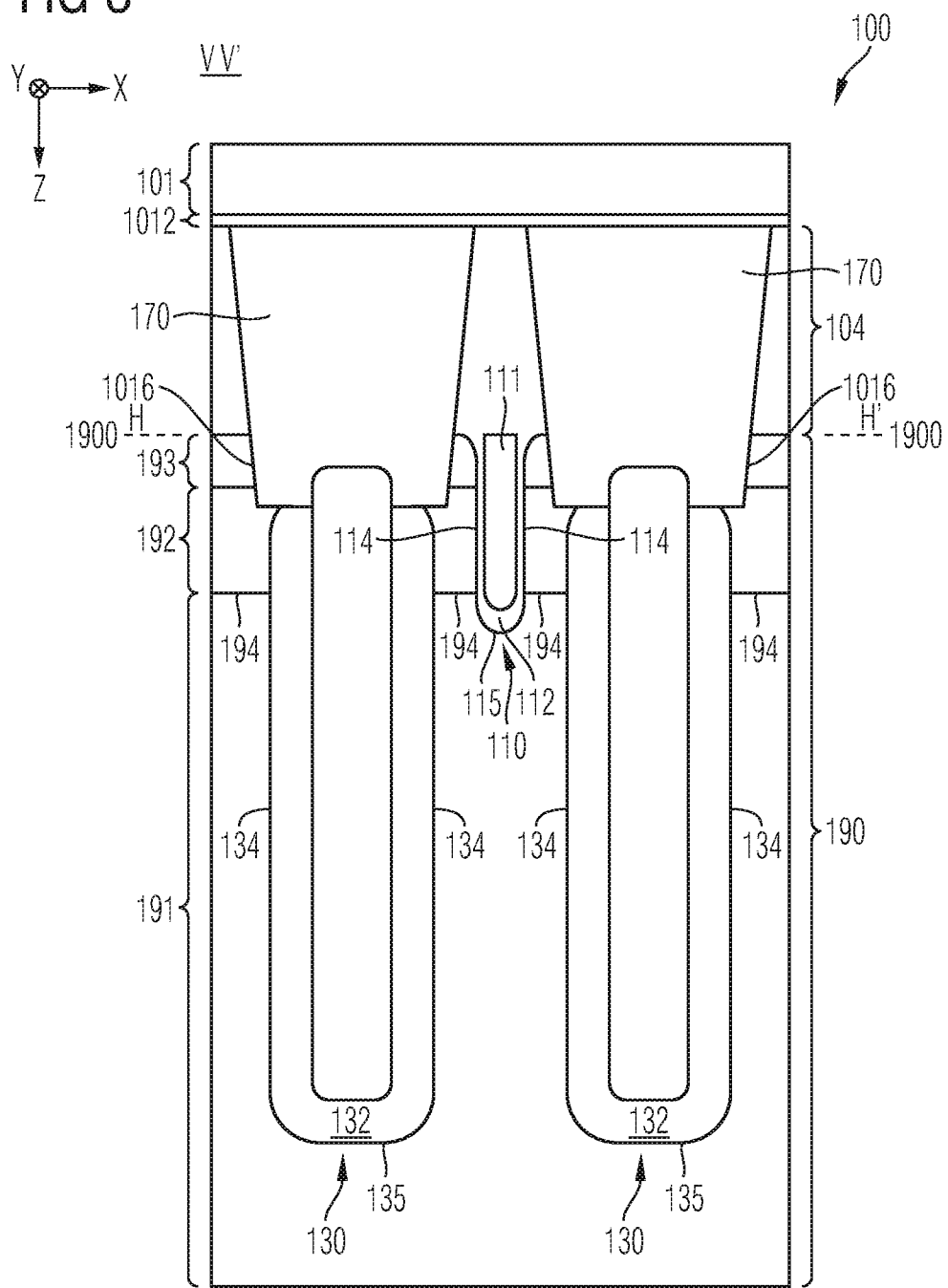
FIG. 3 schematically and exemplarily illustrates a section a section of a vertical cross-section of a power semiconductor die in accordance with one or more embodiments.

FIG. 1 schematically and exemplarily illustrates a section of a horizontal projection of a power semiconductor die 100 in accordance with one or more embodiments. FIGS. 2 and 3 both schematically and exemplarily illustrate a respective section of a vertical cross-section of the power semiconductor die 100 in accordance with some embodiments. In the following, it will be referred to FIGS. 1-3.

The power semiconductor die has a semiconductor body 190 coupled to a first load terminal 101 and a second load terminal 102 of the power semiconductor die 100. The die 100 can be MOSFET and, hence, the first load terminal 101 may be a source (emitter) terminal and the second load terminal 102 may be a drain (collector) terminal.

The first load terminal 101 may be arranged at a front side of the die 100, and the second load terminal 102 may be arranged at a backside of the die 100. The front side of the die 100 may be in proximity to an upper surface 1900 of the semiconductor body 190. For example, the first load terminal 101 includes a front side metallization, and the second load terminal 102 includes a backside metallization.

The semiconductor body 190 is configured to conduct a load current between the load terminals 101, 102, e.g., a load current of at least 5 A, 10 A, of at least 50 A or of even more than 100 A.

The die 100 includes a control trench structure 110 for controlling the load current. The control trench structure 110 extends into the semiconductor body 190 along the vertical direction Z and is arranged in accordance with a horizontal grid pattern having a plurality of grid openings 116, e.g., as illustrated in FIG. 1.

The control trench structure 110 may comprise a control electrode 111 that is electrically insulated from the semiconductor body 190, e.g., by means of a control trench insulator 112. The control electrode 111 may be coupled to an output of a driver unit (not illustrated) and, responsive to a control signal received via the output, set the die 100 in one of the conducting state, during which the load current is conducted between the load terminals 101 and 102, and the blocking state, during which a positive forward voltage is blocked between the load terminals 101 and 102 and flow of the load current is inhibited, the positive forward voltage being present if the electrical potential of the second load terminal 102 is greater than the electrical potential of the first load terminal 101.

For conduction of the load current, the die 100 may comprise a plurality of power cells 120. For example, these power cells 120 are arranged within an active region 105 of the power semiconductor die 100. A die edge 107 laterally terminates the die 100, and an edge termination region 106 is arranged between the die edge 107 and the active region 105. For example, the edge termination region 106 is not configured for conduction of the load current.

The control trench structure 110 extends mainly within the active region 105 and, there, into the semiconductor body 190 along the vertical direction Z, e.g., for a distance of at least 500 nm, at least 600 nm, or at least 700 nm, wherein the extension of the control trench structure 110 along the vertical direction Z may, e.g., be chosen in dependence of the designated maximum blocking voltage of the die 100. For example, the extension of the control trench structure 110 along the vertical direction Z is the distance between the upper surface 1900 and a bottom 115 of the control trench structure 110.

The grid pattern with the plurality of grid openings 116 defines subregions within the active region 105. For example, each grid opening 116 is associated with one of the plurality of power cells 120.

The grid openings 116 are illustrated as exhibiting rectangular horizontal circumference, wherein it shall be understood that the present specification is not limited to such horizontal circumferences; e.g., in another embodiment, the grid openings 116 may exhibit a circular or ellipsoidal circumference or rectangular circumference with rounded corners. However, the grid openings 116 typically exhibit a rectangular horizontal circumference. It shall further be understood that the grid openings 116 must not necessarily be completely surrounded by the respective part of the grid pattern. For example, depending on the design of the control trench structure 110, there may be small gaps (not illustrated), for example, at intersection points between intersecting stripes of the control trench structure 110.

For example, each grid opening 116 exhibits a maximal horizontal extension (cf. distance P (Pitch) indicated in FIG. 2) of no more than a few micrometers, e.g., of no more than 5 μm or of no more than 2 μm. For example, such maximal horizontal extension may be the width of the respective grid opening 116 along the first lateral direction X or the length along the second lateral direction Y, whichever is greater.

Accordingly, each power cell 120 is, in a horizontal cross-section, at least partially arranged in a respective one of the plurality of grid openings 116.

FIG. 2 shows an exemplary configuration of four adjacent grid openings 116, each being associated with one power cell 120.

For example, all power cells 120 have the same configuration. In another embodiment, the power cells 120 may differ in configuration; e.g., it is possible that the active region 105 includes power cells of a first type and power cells of a second type and, optionally, even one or more cells of a further type, e.g., auxiliary cells or dummy cells. The following description refers to the case where at least the power cells 120 are substantially identically configured, wherein, as pointed out, it should be understood that this must not necessarily be the case. Rather, the power cells 120 may also differ from each other.

Each power cell 120 comprises a drift zone section 191 of the first conductivity type, a channel zone section 192 of the second conductivity type and a source zone section 193 of the first conductivity type. The channel zone section 193 isolates the source zone section 192 from the drift zone section 191, wherein the source zone section 192 is electrically connected to the first load terminal 101. Also, the channel zone section 193 may be electrically connected to the first load terminal 101.

As illustrated, the first load terminal 101 may extend within a substantially horizontal layer that is spatially displaced from the semiconductor body 190 at least by means of a first substantially horizontal insulating layer 1012 and, optionally, a second horizontal insulating layer 104.

As will be described in greater detail below, for implementing said electrical connection between the source zone section 193 and the first load terminal 101, contacts 170 may be employed. For example, these contacts 170 penetrate the first insulation layer 1012 (said penetration not being illustrated in FIG. 2) and the second insulation layer 104. For example, in each power cell 120, the source zone section 193 and the channel zone section 192 are arranged in contact with the respective contact 170.

As also illustrated in FIG. 3, the source zone 193 and the channel zone 192 may contiguously extend within the semiconductor body 190, e.g., into each of the power cells 120. Hence, with respect to a respective power cell 120, the formulations "source zone section" and "channel zone section" have been chosen. The same applies to the drift region (section) 191.

A transition between the channel zone 192 and the drift zone 191 forms a pn-junction 194. For example, the drift zone 191 forms the major portion of the semiconductor body 190 and extends along the vertical direction Z until it interfaces with a doped contact region 198 which is electrically connected to the second load terminal 102. The doped contact region 198 may contiguously extend along the lateral directions X and Y so as to form the homogeneous semiconductor layer that horizontally (i.e., along the lateral directions X and Y) overlaps with all power cells 120. For example, the doped contact region 198 comprises or is a field stop layer of the first conductivity type, e.g., the same conductivity type as the drift region 190, but having a higher dopant concentration.

Each power cell 120 further comprises a control section with at least one control electrode section 111 included in the control trench structure 110, as has already been indicated above. The control electrode sections 111 are electrically insulated from each of the first load terminal 101, the second load terminal 102 and the semiconductor body 190.

Regarding the components control electrode section 111, source zone section 193, channel zone section 192 and drift zone section 191, the principal configuration of each power cell 120 corresponds to the typical MOSFET configuration, according to which the control electrode section 111 may induce, upon receiving a corresponding turn-on control signal, an inversion channel within the channel zone section 192, and, upon receiving a corresponding turn off control signal, cut-off this inversion channel. The general operation principle is described in little more detail further below; however; it is such known to the skilled person and the embodiments described herein do not deviate from this general operation principle.

The control electrode sections 111 of the power cells 120 may be formed by a respective monolithic stripe control electrode, these stripe electrodes being included in the stripes of the control trench structure 110 as illustrated in FIG. 1. Hence, it shall also be understood that a specific control electrode section 111 may be associated with two adjacent power cells 120, as illustrated in FIGS. 2 and 3. In other words, each power cell 120 may for example be controlled by means of four control electrode sections 111 that surround the source zone section 193 and the channel zone section 192 of the respective power cell 120.

The control electrode sections 111 may vertically overlap with both the source zone section 193 and the channel zone section 192. In other words, in each power cell 120, the at least one control electrode section 111 and the source zone section 193 may exhibit a first common extension range along the vertical direction Z e.g., of 100 nm, and the at least one control electrode section 111 the channel zone section 192 may exhibit a second common extension range along the vertical direction Z, e.g., of 50 nm. Further, the at least control electrode section 111 may extend as least as deep as said pn-junction 194.

Each power cell 120 may further comprise a columnar field plate trench 130 extending into the semiconductor body 190 along the vertical direction Z and including a field plate electrode 131, e.g., electrically coupled to the first load terminal 101.

For example; the field plate electrodes 131 are electrically connected to the first load terminal 101, e.g., such that the electrical potential of the field plate electrodes 131 is substantially identical to the electrical potential of the first load terminal 101. For example, to implement the electrical connection, also said contacts 170 may be employed that may extend from the first load terminal 101 down to the field plate trenches 130 so as to contact the field plate electrodes 131 and the source zone sections 193. For improving the contact, electrically conductive adhesion promoters 1016 may be used, as illustrated.

Regarding the contacts 170, it shall hence be understood that, as illustrated in FIGS. 2-3, it is possible to electrically connect the first load terminal 101 to each of the channel zone section 192, the source zone section 193 and the field plate electrode 131 by means of a respective joint contact 170. For example, the electrical connection of each power cell 120 to the first load terminal 101 can be effected by means of a respective single joint contact 170, in accordance with an embodiment.

Hence, the contact 170 can be monolithic.

In contrast to the common name "field plate electrode", the field plate electrodes 131 do typically not exhibit the shape of a plate, but rather of a column/needle, as also illustrated in FIGS. 2 and 3.

In each field plate trench 130, a field insulator 132 may be provided that insulates the respective field plate electrode 131 from the semiconductor body 190.

For example, the total vertical extension of each columnar field plate trench 130 amounts to at least twice of the total vertical extension of the control trench structure 110; e.g., each columnar field plate trench 130 extends at least three times as far along the vertical direction Z as compared to the control trench structure 110, e.g., taking the upper surface 1900 of the semiconductor body 190 as a reference. For example, the extension of h columnar field plate trench 130 along the vertical direction Z is the distance between the upper surface 1900 and a bottom 135 of the respective columnar field plate trench 130.

As illustrated in FIGS. 2 and 3, the field insulator 132 forms a field plate trench sidewall 134 of the columnar field plate trench 130. Analogously, the control trench insulator 112 forms control trench sidewalls 114 of the control trench structure 110. Further, in each power cell 120, the control trench structure 110 may surround the columnar field plate trench 130, e.g., as best illustrated in FIG. 2, inner ones of the control trench sidewalls 114 surround the field plate trench sidewall 134. The source zone section 193 can be arranged in contact with both the field plate trench sidewall 134 and the control trench sidewall 114.

In between the (inner) control trench sidewalls 114 and the field plate trench sidewall 134, there may be arranged each of the source zone section 193, the channel zone section 192 and the drift zone section 191 of the respective power cell 120.

As indicated above, for connecting the power cells 120 to the first load terminal, at least one of said contacts 170 may be provided for each power cell 120. In an embodiment, exactly one contact 170 is provided for each power cell 120. Said respective exactly one contact 170 can be monolithic, as indicated above.

Each contact 170 is configured for establishing an electrical connection between the first load terminal 101 and each of the channel zone section 192, the source zone section 193 and the field plate electrode 131 of the respective power cell 120. For example, each contact 170 is configured to form a low ohmic electrical connection between the first load terminal 101 and each of the channel zone section 192, the source zone section 193 and the field plate electrode 131.

Figure 4:
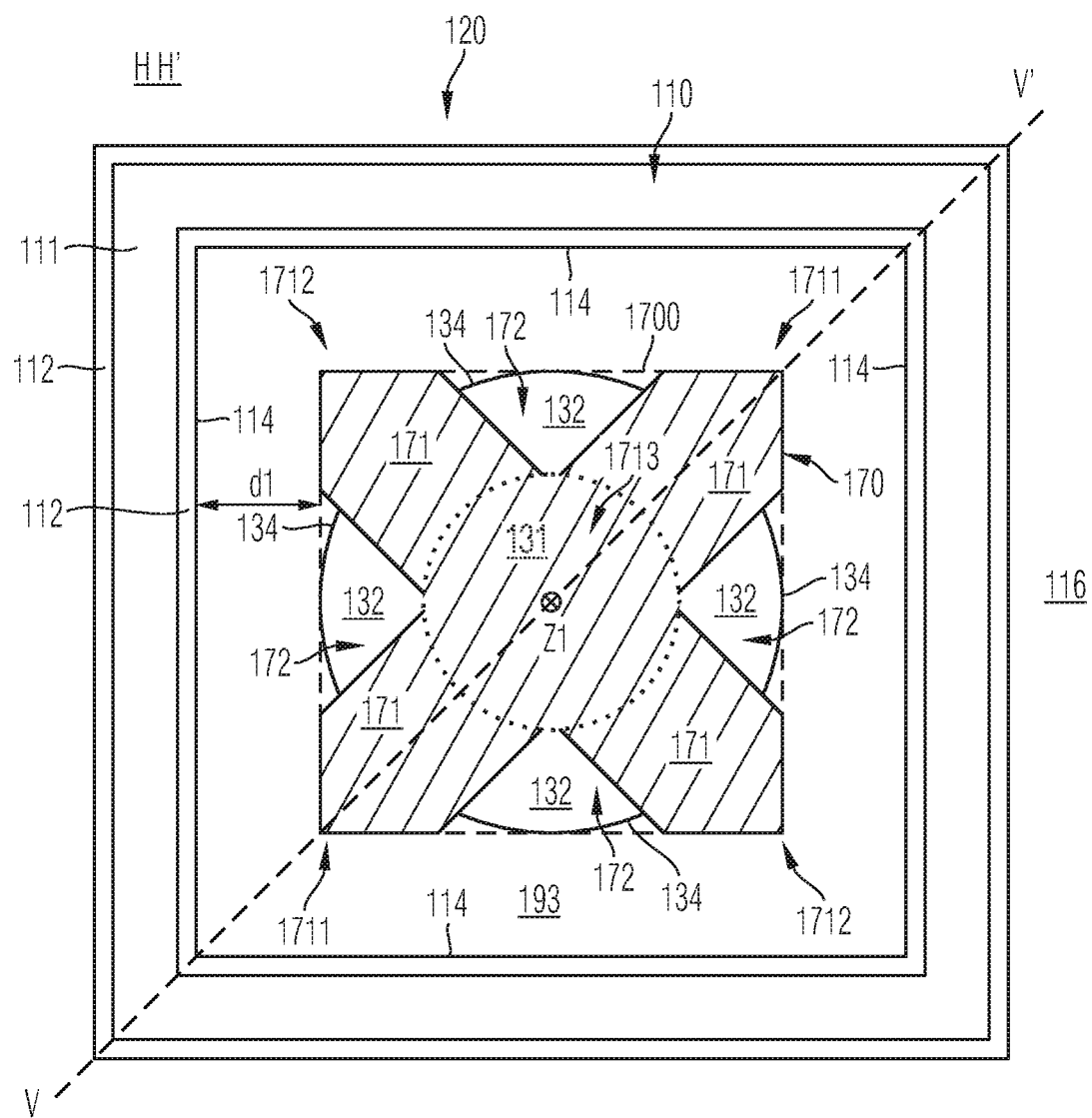
FIG. 4 schematically and exemplarily illustrates a section of a horizontal projection of a contact of a power semiconductor die in accordance with one or more embodiments.

Now referring to FIG. 4, which illustrates a horizontal cross-section of an embodiment of such contact 170, e.g., along or in parallel to line HH' as indicated in FIG. 3, in a horizontal cross-section of the at least one power cell 120:

the contact 170 has a contact region 171 horizontally overlapping with the field plate electrode 131 and horizontally protruding from the field plate trench 130, e.g., so as to make contact with at least one of the channel zone section 192 and the source zone section 193; and a recess region 172 horizontally not overlapping with the contact region 171, but horizontally overlapping with the source zone section 193 and extending into a horizontal circumference of the field plate trench 130.

The field plate electrode 131 may entirely horizontally overlap with the contact region 171, e.g., with a central portion 1713 thereof. Hence, an upper surface of the plate electrode 131 may entirely be covered by the contact region 171.

With respect to the vertical axis Z1 (e.g., the center of the field plate electrode 131), the contact region 171 may extend radially, e.g., radial-symmetrically, e.g., so as to protrude from the field plate trench 13 and to establish the contact with both channel zone section 192 and the source zone section 193. For example, "protruding from the field plate trench 13" may mean that the contact region 171 extends beyond the horizontal circumference of the field plate trench 130.

The horizontal circumference of the field plate trench 13 may be defined by the circumference of the field insulator 132 in said horizontal cross-section. The horizontal circumference of the field plate trench 130 may for example be defined by the field plate trench sidewall 134.

The recess region 172 is electrically insulating. Hence, recess region 172 and contact region 171 do not horizontally overlap with each other in the horizontal cross-section. They may be in direct contact with each other, but are separate components.

Together with the contact region 171, the recess region 172 may hence define the horizontal layout of the structure of the contact 170.

The recess region 172 extends within the horizontal circumference of the field plate trench 130, but does not form a conducting portion between the field plate electrode 131 (or the source zone section 193 or the channel zone section 192) and the first load terminal 101. For example, the recess region 172, e.g., when being filled with an electrically insulating material, can rather act as a support structure for the contact 170.

The recess region 172 may horizontally overlap with both the source zone section 193 and the field insulator 132 of the field plate trench 13.

The contact region 171 of the contact 170 can horizontally protrude out of the horizontal circumference of the field plate trench 130 (e.g., so as to contact at least one of the channel zone section 192 and the source zone section 193) and may also extend within the horizontal circumference of the field plate trench 130 (e.g., so as to contact the field plate electrode 131).

The recess region 172 extends within the horizontal circumference of the field plate trench 130. For example, the contact region 171 and the recess region 172 are arranged complementarily to each other within the horizontal cross-section; e.g., the regions 171 and 172 do not exhibit a common horizontal extension range.

For example, the contact region 171 extends within a rectangular base area 1700 that is defined by an outer envelope course of the contact 170. This outer envelope course can be rectangular. For example, the rectangular base area 1700 is surrounded by the grid opening 116. Further, the grid opening 116 can have a rectangular circumference, and the rectangular base area 1700 can be arranged co-parallel within the grid opening 116. In the illustrated horizontal cross-section, the area between the rectangular base area 1700 and the control trench structure 110, that is the area between the control trench sidewalls 114 and the outer envelope course of the rectangular base area 1700, can be formed by the source zone section 193 and/or the channel zone section 192.

A minimum distance dl between the control trench sidewall 114 facing to a center (cf. Z1 in FIG. 4) of the of the horizontal circumference of the field plate trench 130 and the rectangular base area 1700 can be within the range of, e.g., 50 nm to 300 nm, e.g., within 80 nm to 200 nm, such as 150 nm. For example, the minimum distance dl can be the minimum lateral extension of the source zone section 193 in said area between the control trench sidewalls 114 and the outer envelope course of the rectangular base area 1700. For example, the minimum distance dl defines said horizontal displacement between the contact and the control trench sidewalls 114.

The recess region 172 can be filled with (or, respectively, be made of) an electrically insulating material, and the contact region 171 can be made of an electrically conductive material, and wherein both the insulating material and the conductive material extend with the rectangular base area 1700.

The conductive material may comprise tungsten.

The insulating material may comprise silicon glass ($SiO_2$), e.g., undoped silicon glass or doped silicon glass. Other possible materials include silicon nitride and silicon oxynitride.

The contact 170 (which may be identical for each power cell 120) can have the layout according to the illustrated horizontal cross-section of a vertical extension of at least 150 nm. For example, both the contact region 171 and the at least one recess region 172 extend along the vertical direction Z for at least 150 nm, e.g., without changing in horizontal layout.

Further, as indicated above, the first load terminal 101 may extend within the substantially horizontal layer that is spatially displaced from the semiconductor body 190 at least by means of a substantially horizontal insulating layer(s) (cf. reference numerals 104, 1012). The contact 170 may extend through the insulating layer(s) (cf. reference numerals 104, 1012). Further, as illustrated, the horizontal cross-section of the contact 170 may include a vertical overlap between the at least one control electrode section 111 (and also the source zone section 193) and the contact region 171.

With respect to FIGS. 4 to 7, exemplary horizontal layout structures of the contact 170 shall be described:

For example, at least 30% of the outer envelope course of the contact 170 are defined by the contact region 171, and at least 20% of the outer envelope course of the contact 170 are defined by the recess region 172. Hence, in an embodiment, the outer envelope course of the contact 170 is not entirely defined by the contact region 171, but at least partially by the recess region 172. For example, the recess region 172 may interface with the source zone section 193, as illustrated in FIG. 4.

In an embodiment, at least four separate recess regions 172 extend within the horizontal circumference of the field plate trench 130. For example, each of the four separate recess regions 172 is arranged at one respective side of the four sides of the rectangular base area 1700.

For example, the contact region 171 comprises two bar members 1711, 1712 arranged in accordance with a cross pattern. Additionally or alternatively, the contact region 171 may comprise five block members, wherein the four recess regions 172 and the five block members can be arranged in accordance with a check pattern (cf. FIG. 5, variant (c)).

For example, by horizontally protruding from the field plate trench 130 (e.g., out of the horizontal circumference thereof), distal portions of the bar members 1711, 1712 are configured for contacting both the channel zone section 192 and the source zone section 193. For example, the distal portions of the bar members 1711, 1712 define, at least partially, the outer envelope course of the base area 1700.

It shall be understood that, depending on the arrangement of the channel zone section 192 and the source zone section 193, the contact between the distal portions of the bar members 1711, 1712 with the channel zone section 192 and the source zone section 193 can be established at the same of at a different vertical level (cf. vertical cross-section in FIG. 2).

A central portion 1713 where the bar members 1711, 1712 intersect with each other can be configured for contacting the field plate electrode 131.

In an embodiment, the bar members 1711, 1712 are arranged in parallel with two straights (cf. line VV' in FIG. 4) perpendicularly intersecting the center (Z1) of the horizontal circumference of the field plate trench 130, e.g., with diagonals of the rectangular base area 1700. The bar members 1711, 1712 can horizontally from the field plate trench 130 (e.g., protrude out of the horizontal circumference of the field plate trench 130), e.g., by extending beyond the field insulator 132 so as to contact at least one of the channel zone section 192 and the source zone section 193.

The central portion 1713, e.g., formed by the intersection region of the bar members 1711, 1712, contacts the field plate electrode 131 (cf. dotted line). As indicated above, the field plate electrode 131 can entirely overlap horizontally with the contact region 171, e.g., with said central portion 1713. For example, the central portion 1713 covers entirely an upper surface of the field plate electrode 131.

The four recess regions 172 may partially separate the two bar members 1711, 1712 from each other, such that the cross-pattern is established, as illustrated in FIG. 4. In other words, the distal portions of the bar members 1711, 1712 can be spatially separated from each other by means of the four recess regions 172.

Simultaneously, at least one, more than one or all four recess regions 172 horizontally overlap with (a) the source zone section 193 and, optionally, also with the channel zone section 192 and with (b) the horizontal circumference of the field plate trench 130, e.g., only with the field insulator 132, but not with the field plate electrode 131.

The contact region 171 and the recess region 172 may jointly define, with respect to axis Z1, a radial-symmetrical layout structure of the contact 170.

For example, as illustrated, the central portion 1713 entirely overlaps horizontally with the field plate electrode 131. In other variants, also the recess region 172 may overlap horizontally with the field plate electrode 131.

Figure 5:
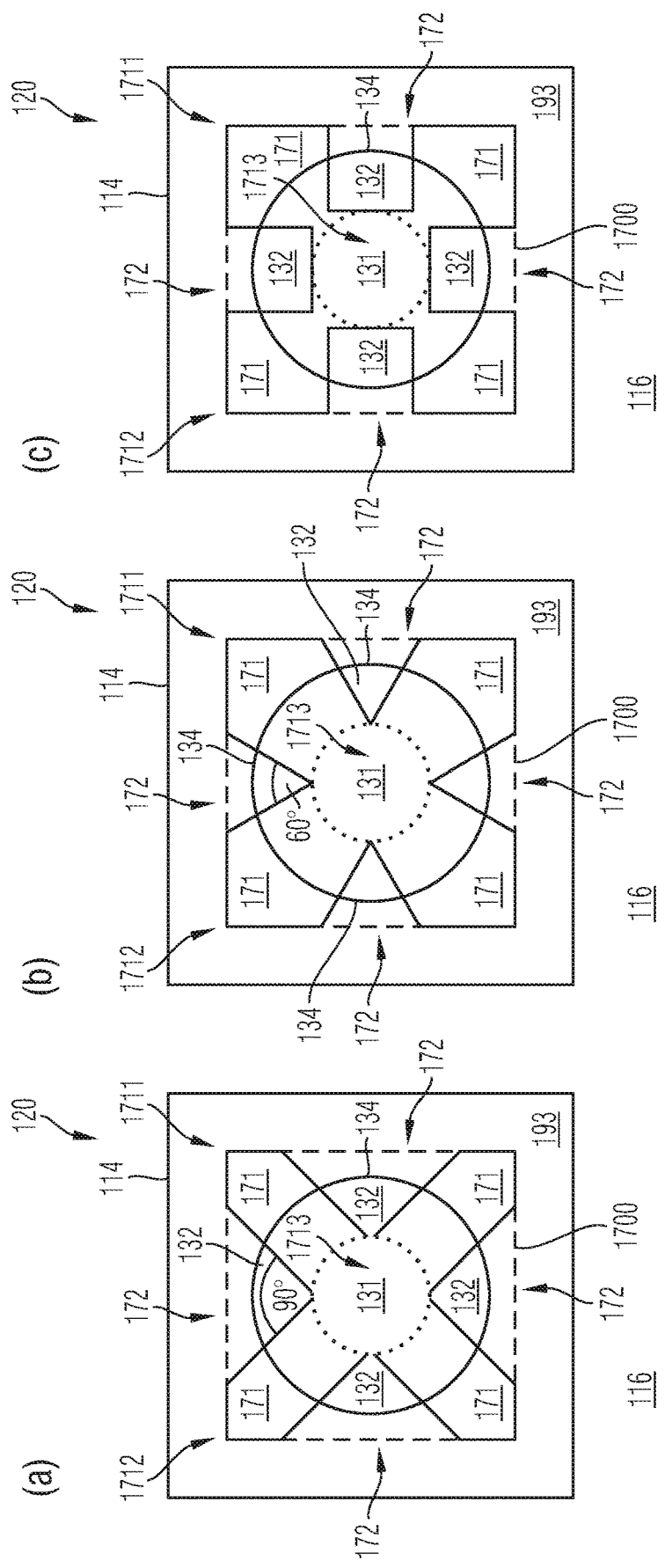
FIG. 5 schematically and exemplarily illustrates sections of a horizontal projection of a contact of a power semiconductor die in accordance with some embodiments.

Many variations and modifications of the cross pattern as illustrated in FIG. 4 are possible:

For example, referring to FIG. 5 variant (a), the bar members 1711, 1712 may be arranged perpendicular to each other within the horizontal cross section, defining an intersection angle of 90°.

Referring to FIG. 5 variant (b), at least one of the bar members 1711, 1712 or both bar members 1711, 1712 may increase in width when extending from the central portion 1713 to one (or both) of its distal portions. This may yield a decreased intersection angle of less than 90°, e.g., less than 60°, and, e.g., a greater area of the contact interface with the source zone section 193. In another embodiment (not illustrated), at least one of the bar members 1711, 1712 decreases in width when extending from the central portion to one of its distal portions; this may yield an increased intersection angle of more than 90° e.g., greater than 110°.

Another variant is illustrated in FIG. 5 (c), according to which the two bar members 1711, 1712 are essentially formed by four outer contact blocks that are interlinked with each other by means of the central portion 1713, e.g., also in the form of a block. This layout structure may yield said check pattern, e.g., with the four recess regions 172 being arranged along the outer rectangular envelope course of the base area 1700 and adjacent to both the central portion 1713 and respective two of the four blocks formed by the bar members 1711, 1712. For example, the five blocks of the contact area 171 and the four blocks of the recess area 172 may each exhibit the substantially same size.

Figure 6:
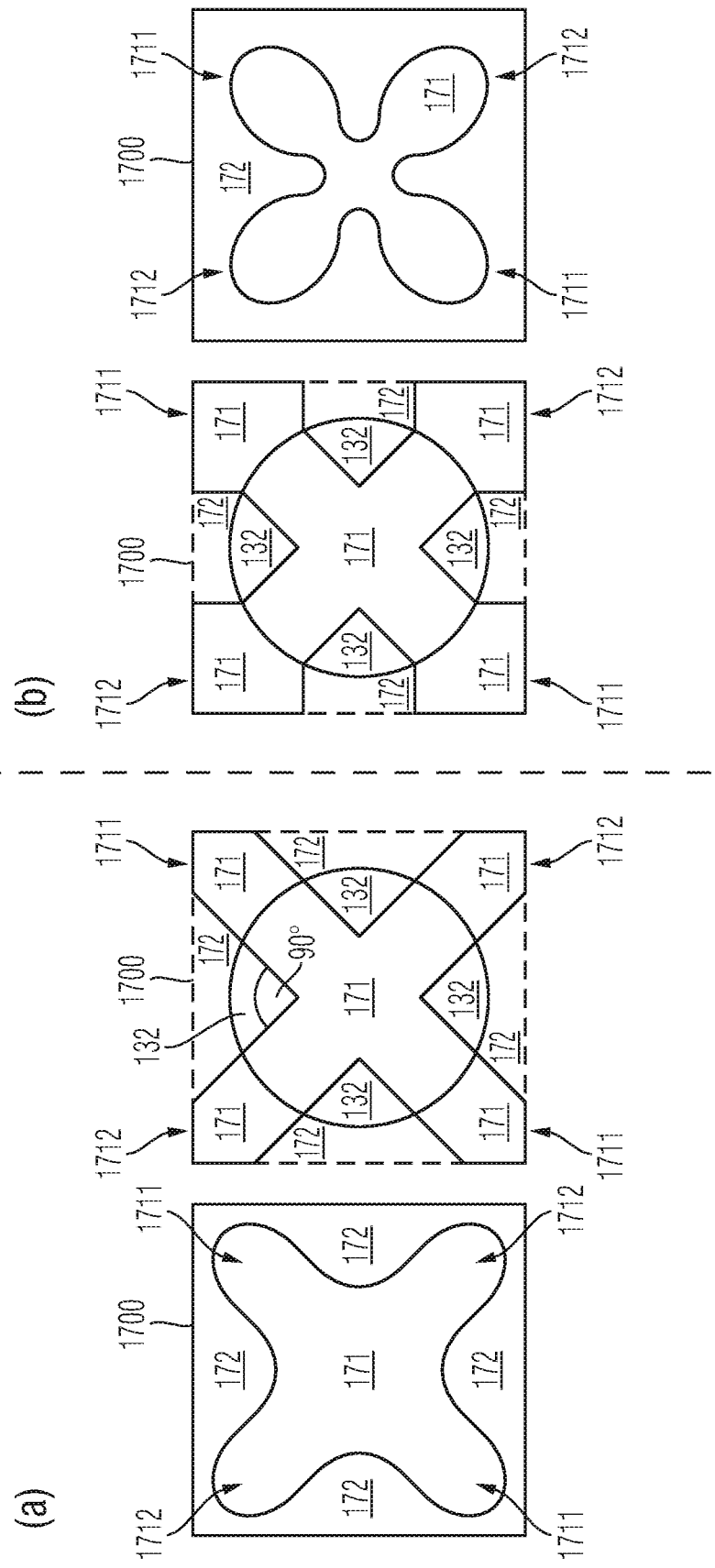
FIG. 6 schematically and exemplarily illustrates sections of a horizontal projection of a contact of a power semiconductor die in accordance with some embodiments.

In FIG. 6, two further variants (a) and (b) are illustrated. Variant (a) corresponds to FIG. 4, in so far, it is referred to the above. However, in FIG. 6, the field plate electrode 131 is not illustrated. Whereas the right section of variant (a) shows the layout according to which a corresponding processing method can be carried out (e.g., a standard layout according to a lithographic mask), the left section illustrates that after processing, the layout might be slightly blurred; e.g., the intersection angle of 90° is not strictly maintained; but results in a rounded corner, as illustrated in the left section.

Variant (b) of FIG. 6 can be considered as a combination of the variant (a) of FIG. 6 (i.e., variant of FIG. 4) and the variant of FIG. 5 (c), e.g., a combination of cross pattern and a check pattern. Again, as illustrated in the right section of variant (b) in FIG. 6, such strict layout might be slightly blurred after carrying out the corresponding processing steps. Yet, with the layout according FIG. 6 (b), left section, an eventually desired cross-pattern of the contact 170 (cf. right section of FIG. 6 (b) can be more appropriately achieved as compared to the variant according to FIG. 6 (a).

Further exemplary layout structures of the contact 170 will be explained with respect to FIG. 7.

In accordance with one or more embodiments described herein; the contact 170 exhibits, within said horizontal cross-section, no more than one horizontal axis of symmetry HS.

Figure 7:
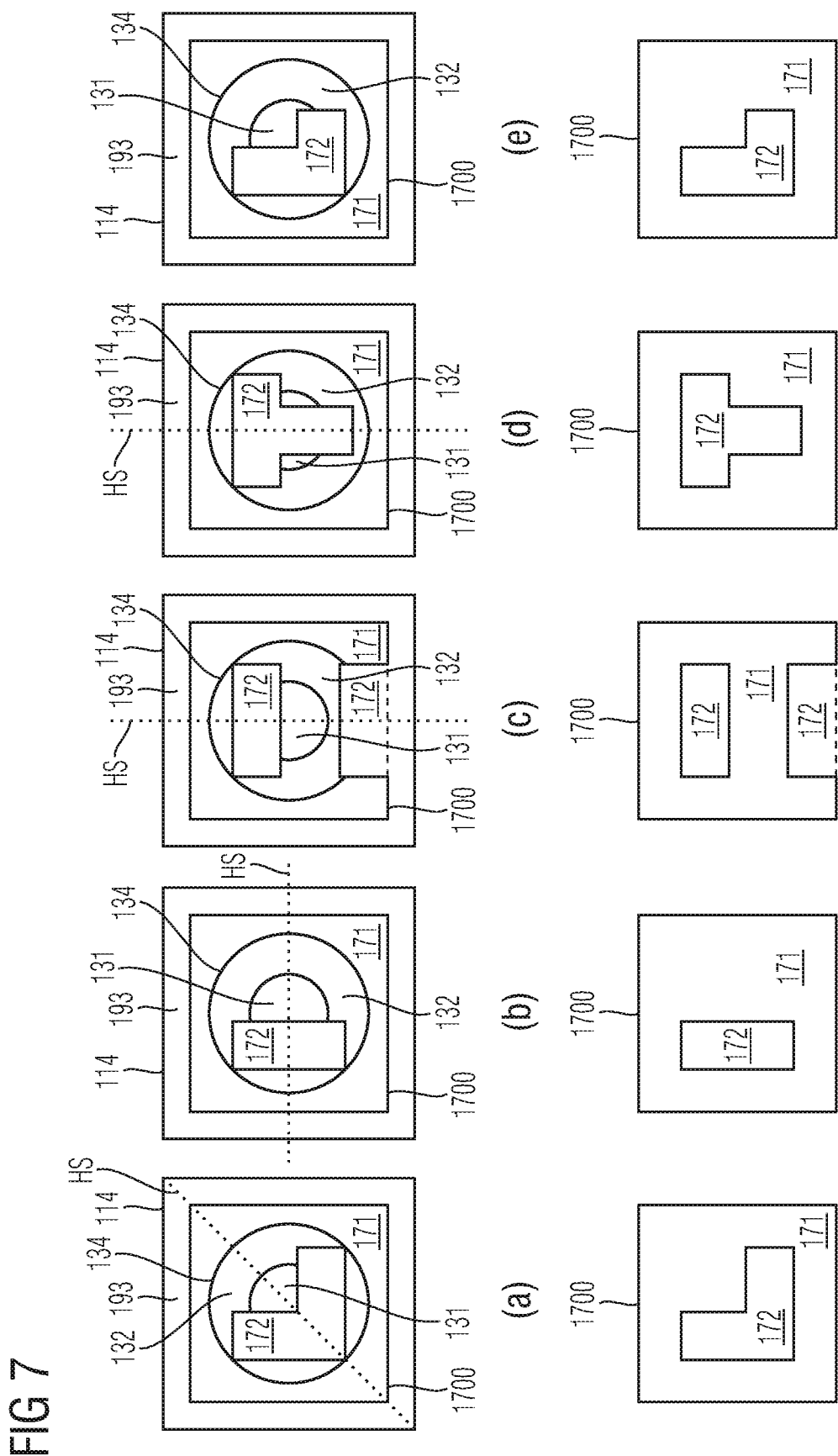
FIG. 7 schematically and exemplarily illustrates sections of a horizontal projection of a contact of a power semiconductor die in accordance with some embodiments.

For example, referring to variant (a) of FIG. 7, the horizontal layout can have an L-structure, wherein a single recess region 172 forms a symmetrical L-shaped recess, e.g., within the rectangular base area 1700. For example, the single horizontal axis of symmetry HS extends diagonally within the rectangular base area 1700. Further, the symmetrical L-shaped recess formed by the single recess region 172 can be entirely surrounded by the contact region 171; i.e., in this embodiment, the outer envelope course of the rectangular base area 1700 is entirely defined by the contact region 171.

Referring to variant (b) of FIG. 7, the horizontal layout can have an I-structure, wherein a single recess region 172 forms a symmetrical I-shaped recess; e.g., within the rectangular base area 1700. For example, the single horizontal axis of symmetry HS extends in parallel with one of the sides of the rectangular base area 1700. Further; the symmetrical I-shaped recess formed by the single recess region 172 can be entirely surrounded by the contact region 171; i.e., also in this embodiment, the outer envelope course of the rectangular base area 1700 is entirely defined by the contact region 171.

Referring to variant (c) of FIG. 7, the horizontal layout can have a double I-structure, wherein a two recess regions 172 form two symmetrically arranged I-shaped recesses, e.g., within the rectangular base area 1700. For example, the single horizontal axis of symmetry HS extends in parallel with one of the sides of the rectangular base area 1700. Further, the I-shaped recesses formed by the two recess region 172 can be partially surrounded by the contact region 171; i.e., in this embodiment, the outer envelope course of the rectangular base area 1700 is not entirely defined by the contact region 171, but also by one of the two recess regions 172. For example, the two recess regions 172 are not centrally arranged within the rectangular base area 1700 such that the contact 170 indeed exhibits only the single horizontal axis of symmetry HS.

Another possibility is shown in variant (d) of FIG. 7, according to which the horizontal layout can have a T-structure, wherein a single recess region 172 forms the single T-shaped recess, e.g., within the rectangular base area 1700. For example, the single horizontal axis of symmetry HS extends in parallel with one of the sides of the rectangular base area 1700. Further, the T-shaped recess formed by the single recess region 172 can be entirely surrounded by the contact region 171; i.e., in this embodiment, the outer envelope course of the rectangular base area 1700 is again entirely defined by the contact region 171.

Variant (e) is a slight modification of variant (a) of FIG. 7; in accordance with this embodiment, the single recess region 172 forms a non-symmetrical L-shaped recess, e.g.; within the rectangular base area 1700. Hence, the contact 170 does not exhibit any horizontal axis of symmetry HS.

Referring to all variants (a) to (e) of FIG. 7, as illustrated in respective upper sections of FIG. 7, the recess region(s) 171 may horizontally overlap with the both the field plate electrode 131 and the field insulator 132. The contact region 171 horizontally overlaps with both the field plate electrode 131 and the source zone section 193.

Herein presented are also embodiments of a method of processing a power semiconductor die. For example, the method comprises forming a semiconductor body to be coupled to a first load terminal and a second load terminal of the power semiconductor die and configured to conduct a load current between the load terminals. The method further comprises forming at least one power cell having: as a respective part of the semiconductor body, a section of a drift zone of a first conductivity type, a section of a channel zone of a second conductivity type and a section of a source zone of the first conductivity type, wherein the channel zone section is electrically connected to the first load terminal and isolates the source zone section from the drift zone section; a columnar field plate trench extending into the semiconductor body along the vertical direction, the columnar field plate trench including a field plate electrode and a field insulator, the field insulator forming a field plate trench sidewall of the columnar field plate trench; a control trench structure for controlling the load current, the control trench structure extending into the semiconductor body along the vertical direction and surrounding the columnar field plate trench, the control trench structure including at least one control electrode section and a control trench insulator, the control trench insulator forming control trench sidewalls of the control trench structure; a contact configured for establishing an electrical connection between the first load terminal and each of channel zone section, the source zone section and the field plate electrode, wherein, in a horizontal cross-section of the at least one power cell: the contact has a contact region horizontally overlapping with the field plate electrode and horizontally protruding from the field plate trench: and a recess region horizontally not overlapping with the contact region, but horizontally overlapping with the source zone section and extending into a horizontal circumference of the field plate trench.

Embodiments of the method described above may correspond to the embodiments of the power semiconductor die 100 that have been described with respect to FIGS. 1 to 7. Hence, regarding exemplary embodiments of the methods, it is fully referred to the above.

In particular, it shall be understood that the sequence of executing the individual method steps may be appropriately chosen by the skilled person.

Figure 8:
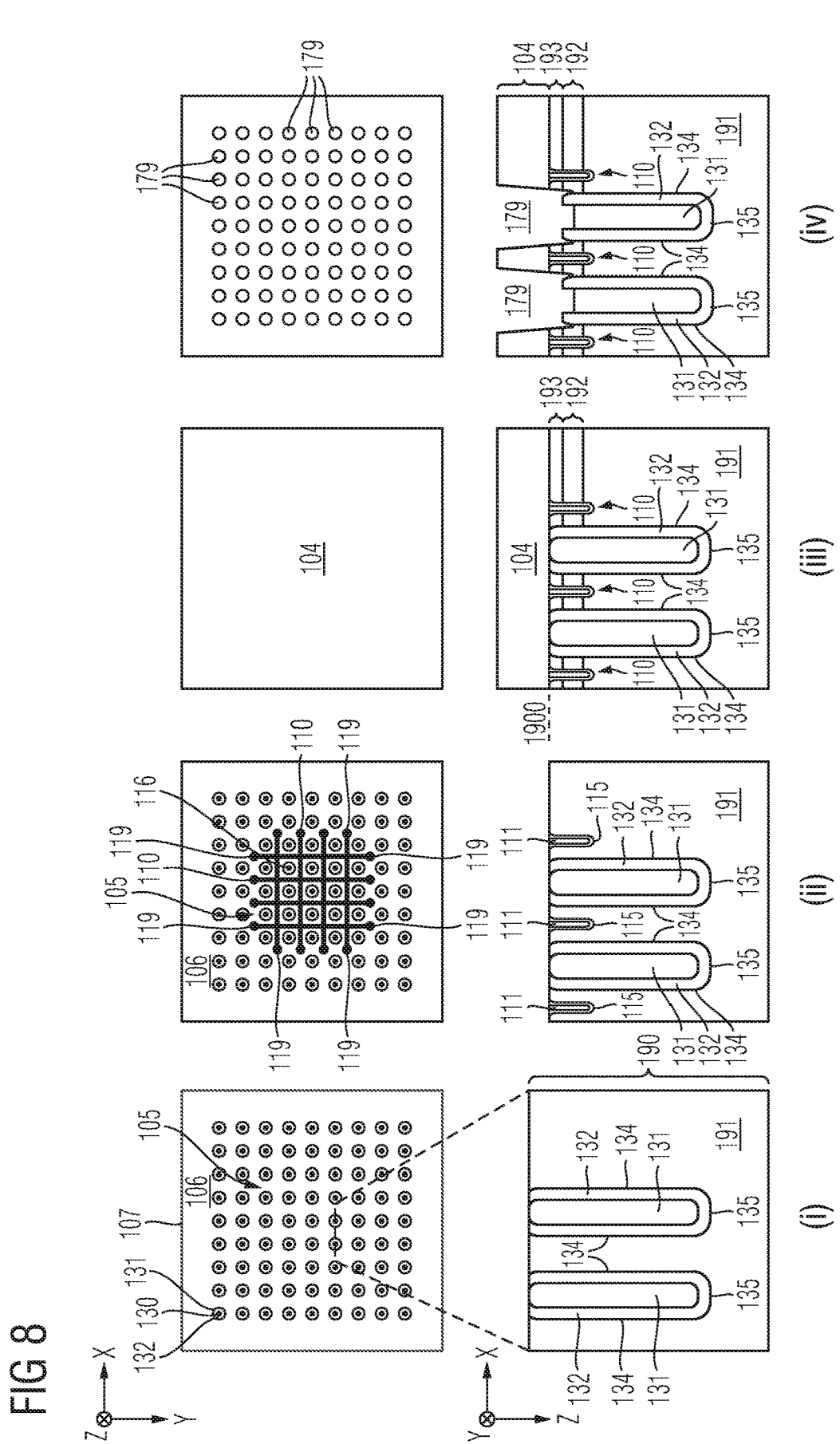
FIG. 8 schematically and exemplarily illustrates aspects of a method of processing a power semiconductor die in accordance with some embodiments.

Aspects of an exemplary embodiment of the method will now be explained with respect to FIG. 8, which schematically illustrates different processing stages based (i) to (iv) on corresponding states of the processed power semiconductor die 100, indicated by both a respective section of a horizontal projection (upper part of FIG. 8) and a respective section of a vertical cross-section (lower part of FIG. 8).

For example, at stage (i), the columnar field plate trenches 130 are formed in the active region 105. Forming the columnar field plate trenches 130 can be carried out in typical manner known to the skilled person.

At stage (ii), the control trench structure 110 is formed. Also forming the control trench structure 110 can be carried out in typical manner known to the skilled person. In contrast to the schematic illustration, the control structure 110 can be formed within the entire cell field where the columnar field plate trenches 130 have been formed, not only in the illustrated central portion.

Stage (iii) shows the die 100 after the source zone 193 and the channel zone 192 have been formed in the semiconductor body 190 and after the insulating layer 104 has been provided at the upper surface 1900 (not showing the other insulating layer 1012).

Thereafter, contact recesses 179 may be formed (cf. stage (iv)) that expose, within each designated power cell 120 each of the channel zone section 192, the source zone section 193 and the field plate electrode 131. This may include a masked etching processing step. After the etching processing step, a further implantation processing step and/or an annealing processing step may be carried out.

Subsequent (non-illustrated) stages relate to forming the contacts 170 within the contact recesses 179. For example, the contact recesses 179 are formed in accordance with the designated layout structure of the contact 170.

For example, in case of the cross-pattern, a correspondingly structured mask having cross-patterns can be used for forming the contact recesses 179 in layer 104. Providing such mask may be followed by a photolithographic processing step, an anisotropic oxide etch processing step, an anisotropic Si etch processing step. For example, thereafter, a body implantation processing step may be carried out for improving the electrical contact to the channel zone sections 192. For example, thereafter, the recesses 179 are filled with a conductive material (e.g., including one or more of the following materials: titanium (Ti), titanium-nitrogen (TiN) and tungsten (W).) for forming the contact regions 171.

In more general terms, in the above, an embodiment of a semiconductor die 100 has been presented that may include a semiconductor substrate (e.g., semiconductor body 190) with gate trenches (e.g., control trench structure 110) extending into the front surface (e.g., upper surface 1900) of the semiconductor substrate. The semiconductor substrate can comprise any type of semiconductor material such as a single element semiconductor (e.g. Si, Ge, etc.), silicon-oninsulator, a binary semiconductor (e.g. SiC, GaN, GaAs, etc.), a ternary semiconductor, etc. with or without epitaxial layer(s). A gate electrode (e.g., control electrode sections 111) and a gate dielectric (e.g., trench insulator 112) are disposed in each gate trench, the gate dielectric separating the corresponding gate electrode from the semiconductor substrate. A field plate (e.g., field plate electrode 131) can be disposed in columnar field plate trenches 130, each field plate being separated from the semiconductor substrate and the corresponding gate electrode by a field dielectric (e.g., field insulator 132) that is, e.g., thicker than the gate dielectric. Alternatively or additionally, field plates can be disposed in trenches that house also the gate electrodes.

A first (source/emitter) region (e.g. source zone 193) having a first conductivity type (e.g. n-type in the case of an n-channel device, or p-type in the case of a p-channel device) is formed in the semiconductor substrate at the front surface and adjacent each gate trench. A second (body) region (e.g. channel zone 192) having a second conductivity type (e.g. p-type in the case of an n-channel device, or n-type in the case of a p-channel device) is formed in the semiconductor substrate below the source/emitter region and adjacent each gate trench. A third (drift) region (e.g. drift zone 191) having the first conductivity type is formed in the semiconductor substrate, e.g. as part of an epitaxial layer, below the body region and adjacent each gate trench. A drain/collector region (cf. doped contact region 198) of the first conductivity type is formed at the back surface of the semiconductor substrate opposite the front surface, and is doped more heavily than the drift region. Further, in particular in case another material than Si is used, one could also imagine a pnp instead of an npn MOSFET.

The semiconductor die illustrated can be a vertical power MOSFET which has a channel zone that extends in the vertical direction Z along gate dielectric (cf. 112) in the body region (cf. 192). By applying a sufficient gate voltage to the gate electrodes, minority carriers (electrons in the case of a p-type body region, or holes in the case of an n-type body region) collect along the gate dielectric in the channel region and an electrically conductive path is completed between the source/emitter region and the drain/collector region via the drift and channel regions.

In the above, embodiments pertaining to power semiconductor dies and corresponding processing methods were explained. For example, these semiconductor dies are based on silicon (Si). Accordingly, a monocrystalline semiconductor region or layer or section can be a monocrystalline Si-region or Si-layer. In other embodiments, polycrystalline or amorphous silicon may be employed.

It should, however, be understood that the semiconductor die can be made of any semiconductor material suitable for manufacturing a semiconductor die. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor die having a semiconductor body coupled to a first load terminal and a second load terminal of the power semiconductor die and configured to conduct a load current between the first and second load terminals, the power semiconductor die comprising at least one power cell having:
   as a respective part of the semiconductor body, a section of a drift zone of a first conductivity type, a section of a channel zone of a second conductivity type and a section of a source zone of the first conductivity type, the channel zone section being electrically connected to the first load terminal and isolating the source zone section from the drift zone section;
   a columnar field plate trench extending into the semiconductor body along a vertical direction, the columnar field plate trench including a field plate electrode and a field insulator, the field insulator forming a field plate trench sidewall of the columnar field plate trench;
   a control trench structure configured to control the load current, the control trench structure extending into the semiconductor body along the vertical direction and surrounding the columnar field plate trench, the control trench structure including at least one control electrode section and a control trench insulator, the control trench insulator forming control trench sidewalls of the control trench structure; and
   a contact configured to establish an electrical connection between the first load terminal and each of the channel zone section, the source zone section and the field plate electrode,
   wherein in a horizontal cross-section of the at least one power cell:

the contact has a contact region horizontally overlapping with the field plate electrode and horizontally protruding from the field plate trench; and
a recess region not overlapping with the contact region in a plane view, and the recess region extending into a horizontal circumference of the field plate trench.

2. The power semiconductor die of claim 1, wherein the recess region horizontally overlaps with the source zone section.

3. The power semiconductor die of claim 1, wherein the recess region is electrically insulating, and wherein the contact region is electrically conductive.

4. The power semiconductor die of claim 1, wherein at least four separate recess regions extend within the horizontal circumference of the field plate trench, and wherein the contact region comprises two bar members arranged in a cross pattern.

5. The power semiconductor die of claim 4, wherein distal portions of the two bar members are configured to contact both the channel zone section and the source zone section, and wherein a central portion where the two bar members intersect with each other is configured to contact the field plate electrode.

6. The power semiconductor die of claim 5, wherein at least one of the two bar members increases in width when extending from the central portion to a distal portion of the bar member.

7. The power semiconductor die of claim 5, wherein at least one of the two bar members decreases in width when extending from the central portion to a distal portion of the bar member.

8. The power semiconductor die of claim 4, wherein distal portions of the two bar members are spatially separated from each other by the four recess regions.

9. The power semiconductor die of claim 4, wherein the two bar members are arranged in parallel with two straights perpendicularly intersecting a center of the horizontal circumference of the field plate trench.

10. The power semiconductor die of claim 1, wherein four separate recess regions extend within the horizontal circumference of the field plate trench, and wherein the contact region comprises five block members, and wherein the four recess regions and the five block members are arranged in a check pattern.

11. The power semiconductor die of claim 1, wherein the contact region is radial-symmetrical with respect to a vertical axis intersecting a center of the field plate electrode.

12. The power semiconductor die of claim 1, wherein the field plate electrode overlaps entirely with the contact region.

13. The power semiconductor die of claim 1, wherein within the horizontal circumference of the field plate trench, the recess region overlaps horizontally exclusively with the field insulator but not with the field plate electrode.

14. The power semiconductor die of claim 1, wherein the control trench structure is arranged in a horizontal grid pattern having a plurality of grid openings, and wherein the at least one power cell is at least partially arranged within one of the grid openings.

15. The power semiconductor die of claim 14, wherein each grid opening has a maximal horizontal extension of no more than 5 µm.

16. The power semiconductor die of claim 1, wherein both the contact region and the recess region extend along the vertical direction for at least 150 nm.

17. The power semiconductor die of claim 1, wherein the first load terminal extends within a substantially horizontal layer that is spatially displaced from the semiconductor body at least by a substantially horizontal insulating layer, and wherein the contact extends through the insulating layer.

18. The power semiconductor die of claim 1, wherein the horizontal cross-section includes a vertical overlap between the at least one control electrode section and the contact region.

19. The power semiconductor die of claim 1, wherein the contact is electrically connected to the first load terminal.

20. The power semiconductor die of claim 1, wherein the contact has, within the horizontal cross-section, no more than one horizontal axis of symmetry.

21. A method of processing a power semiconductor die, the method comprising:
providing a semiconductor body to be coupled to a first load terminal and a second load terminal of the power semiconductor die and configured to conduct a load current between the load terminals; and
forming at least one power cell having:
as a respective part of the semiconductor body, a section of a drift zone of a first conductivity type, a section of a channel zone of a second conductivity type and a section of a source zone of the first conductivity type, the channel zone section being electrically connected to the first load terminal and isolating the source zone section from the drift zone section;
a columnar field plate trench extending into the semiconductor body along the vertical direction, the columnar field plate trench including a field plate electrode and a field insulator, the field insulator forming a field plate trench sidewall of the columnar field plate trench;
a control trench structure configured to control the load current, the control trench structure extending into the semiconductor body along the vertical direction and surrounding the columnar field plate trench, the control trench structure including at least one control electrode section and a control trench insulator, the control trench insulator forming control trench sidewalls of the control trench structure;
a contact configured to establish an electrical connection between the first load terminal and each of the channel zone section, the source zone section and the field plate electrode,
wherein in a horizontal cross-section of the at least one power cell:
the contact has a contact region horizontally overlapping with the field plate electrode and horizontally protruding from the field plate trench; and
a recess region not overlapping with the contact region in a plane view, and the recess region extending into a horizontal circumference of the field plate trench.

22. The method of claim 21, wherein the recess region horizontally overlaps with the source zone section.

* * * * *